United States Patent
Ikoma et al.

(10) Patent No.: US 7,792,663 B2
(45) Date of Patent: Sep. 7, 2010

(54) CIRCUIT SIMULATION METHOD

(75) Inventors: Daisaku Ikoma, Osaka (JP); Kyoji Yamashita, Osaka (JP); Yasuyuki Sahara, Osaka (JP); Katsuhiro Ootani, Osaka (JP); Tomoyuki Ishizu, Osaka (JP)

(73) Assignee: Panasonic Corporation, Osaka (JP)

( * ) Notice: Subject to any disclaimer, the term of this patent is extended or adjusted under 35 U.S.C. 154(b) by 443 days.

(21) Appl. No.: 11/822,781

(22) Filed: Jul. 10, 2007

(65) Prior Publication Data

US 2008/0077378 A1 Mar. 27, 2008

(30) Foreign Application Priority Data

Sep. 27, 2006 (JP) .............................. 2006-262345

(51) Int. Cl.
*G06F 17/10* (2006.01)
(52) U.S. Cl. .................... 703/2; 703/14; 716/4; 716/10
(58) Field of Classification Search .................... 703/2, 703/13, 14; 716/1, 4, 10
See application file for complete search history.

(56) References Cited

U.S. PATENT DOCUMENTS 7,476,957 B2 * 1/2009 Watanabe et al. ........... 257/499
2002/0083399 A1 * 6/2002 Chatterjee et al. ............... 716/1
2004/0044511 A1 * 3/2004 Sekido et al. .................. 703/14
2006/0259881 A1 * 11/2006 Sahara et al. .................. 716/4
2007/0018209 A1 * 1/2007 Sahara et al. ............... 257/288

FOREIGN PATENT DOCUMENTS

JP 2003-264242 9/2003

OTHER PUBLICATIONS

Smeys et al., P. Influence of Process-Induced Stress on Device Characteristics and its Impact on Scaled Device Performance, IEEE Transactions on Electron Devices, vol. 46, No. 6, Jun. 1999, pp. 1245-1252.*
Moroz, V., et al., "Stress-Aware Design Methodology", International Symposium on Quality Electronic Design, 2006, pp. 807-812.

* cited by examiner

*Primary Examiner*—Russell Frejd
(74) *Attorney, Agent, or Firm*—McDermott Will & Emery LLP

(57) ABSTRACT

A circuit simulation apparatus has a means to acquire data regarding a transistor, a model parameter generation unit for generating a model parameter representing effects of stress upon the transistor active region caused by the isolation region, and a simulation execution unit for evaluating characteristics of the transistor using a simulation program associated with the model parameter. The model parameter includes a term regarding width of the transistor active region, a term regarding width of the peripheral active region, and a term regarding width between the transistor active region and the peripheral active region.

21 Claims, 8 Drawing Sheets

CIRCUIT SIMULATION METHOD

This non-provisional application claims priority based on Patent Application No. 2006-262345 filed in Japan on Sep. 27, 2006, the entire contents of which are hereby incorporated by reference.

BACKGROUND OF THE INVENTION

1. Technical Field

The present invention relates to a simulation method and a simulation apparatus for a semiconductor integrated circuit, and more particularly, to a circuit simulation method and apparatus that carry out a highly accurate circuit simulation while taking into consideration effects that stress has on the electrical characteristics of a transistor.

2. Related Art

With the enhanced performance and integration of large scale integrated (LSI) circuits, it is increasingly important to minimize the isolation regions that electrically isolate the elements on semiconductor substrates. Semiconductor processing techniques involving sub-0.18 Mm for the minimum line width usually employ shallow trench isolation (STI) technology, which includes forming trenches between the elements and depositing insulating films in the formed trenches, thus realizing isolation of the elements.

When STI technology is used, the active region, where semiconductor elements are formed, and the STI region, which is made of an insulating film, have different heat expansion coefficients, resulting in stress (STI stress) applied to the interface between the active region and the STI region during the heat treatment step. The active region has a larger heat expansion coefficient than that of the STI region, and thus, for example, turns into a relaxed state in raised temperature. In lowered temperature, compressive stress is applied to the active region due to its shrinking force. When the compressive force is extremely large, misalignment occurs to the active region and the crystal of the insulating film, causing point defects and cracks on elements. The point defects and cracks serve as the recombination center in energy gaps and thus increase leakage current, causing defective elements. Even when the stress is several tens to several hundreds of megapascals, which is a degree short of causing defects or cracks, a transistor formed in the active region will be distorted. In particular, when forming in the active region a metal-insulator-semiconductor field effect transistor (MISFET), which is minute in size, the effects by the stress are extensive even to the channel region, which will be distorted.

Distortion is influential to the electrical characteristics of the MISFET in two viewpoints. For one, the energy band structure of silicon is deformed, and for the other, the diffusion coefficient of impurities is varied.

Since the energy band originates in crystal periodicity (periodic potential), crystal distortion directly affects the structure of the energy band. There are roughly two effects on the energy band structure, one being that a band which was degenerated in accordance with the symmetry of the crystal lattice is split by distortion. This increases carriers that contribute to electrical conduction in the band of lower energy. The larger the effective mass of the carriers of the lower energy band becomes, the less carrier mobility becomes, and vice versa. Because carrier mobility is approximately proportionate to drain current, the drain current is also varied by the distortion. When there is an energy splitting far exceeding thermal fluctuation (up to 40 meV), the probability of inter-valley scattering (optical phonon scattering) decreases, thereby increasing carrier mobility. Additionally, because the band ends are displaced in varied ways, leakage current at the junction, junction capacitance, and the threshold voltage of the MISFET are also influenced.

As the other effect that distortion has on the energy band structure, the curvature of energy relative to wavenumber is varied. The curvature of energy is inversely proportionate to the effective mass of carriers, that is, proportionate to carrier mobility, and thus the electrical characteristics of the MISFET are directly affected by variations in curvature. Although variations in curvature also affect the probability of inner-valley scattering (acoustic phonon scattering), this is considered to be of little consequence in the practically applicable range.

Variations in the diffusion coefficient of impurities due to distortion causes, for example, a reduced diffusion coefficient of boron in compressive stress, which in turn causes variations in the threshold voltage in an N-channel MISFET (NMISFET) using boron for channel implantation or pocket implantation.

Among the aforementioned various effects that distortion has on the electrical and physical characteristics of the MISFET, variations in carrier mobility and in threshold voltage are particularly critical in that integrated circuits are largely affected.

In MISFETs of sub-90 nm for the minimal line width, in view of recent difficulty in improving the driving force by the conventional scaling, an attempt is being made to develop technology that utilizes the improvement in carrier mobility due to distortion. Stress (STI stress) generated by STI depends on the layout pattern of the active region and the STI region, the degree of distortion applied to the transistor being varied upon change in the layout pattern. Thus, in a standard cell and custom design of the cell based system, which involves complicated layout patterns, there are transistors of various characteristics depending on the layout pattern, even though these transistors have the same gate length and gate width. Variations in the characteristics of transistors depending on the layout pattern are a cause of calculation errors in circuit simulation. In order to improve the accuracy of prediction of circuit simulation, the dependency of STI stress on the layout pattern must be taken into consideration in the circuit simulation. For example, patent document 1, the entire contents of which being herein incorporated by reference, describes a simulation that takes into consideration the dependency of STI stress on the layout pattern.

A simulation described in patent document 1 will be described below referring to a drawing. FIG. 13 is a schematic diagram of a layout pattern of a MISFET where an STI region formed of an insulating film and electrically isolating an element and an active region surrounded by the STI region are formed. Above the active region, a gate electrode is formed with an insulating film in between, and thus a MISFET is complete for operation.

Stress occurs at the interface between the active region and the STI region, and compressible stress occurs at the channel portion of the MISFET. Although pulling stress may occur depending on a method by which the element isolating film in the STI region is formed, the resulting model will not be essentially different; only with some changes occur in sign and size of model parameters in the simulation. Although the size of stress occasionally reaches 500 MPa, the lattice distortion of silicon is small relative to the lattice constant, at most approximately 1%. Therefore, the stress and distortion are in a linear relationship, that is, can be represented by Hooke's law. In the case of a distortion with a stress of equal to or lower than 500 MPa, the distortion and carrier mobility are in a linear relationship, that is, a piezoresistance model can be well applied here. Therefore, the stress is proportionate to carrier mobility.

Japanese Patent Application Publication No. 2003-264242, the entire contents of which being herein incorporated by reference, proposes a model in which carrier mobility is inversely proportionate to an active area width SA, which is the distance between a gate end and an active area end in the length direction of the gate, which is realized by assuming that stress is inversely proportional to the active area width SA. The publication also proposes a model for the threshold voltage of a MISFET on the analogy of the model for carrier mobility, i.e., the threshold voltage is inversely proportionate to the active area width SA. Other examples include a BSIM4 model, developed by the University of California, Berkley. The BSIM4 model is in use incorporating a model in which carrier mobility and threshold voltage are inversely proportionate to (SA+0.5×L). These conventional models can accurately represent variations in transistor characteristics due to stress in MISFETs of simple layout patterns such as the one shown in FIG. 13.

Actually, however, a plurality of transistors are formed, and it is known that the size of STI stress applied to the active region depends not only on the active area width SA but on, for example, the area ratio of the adjacent active region (see, for example, Victor Moroz, et al., "Stress-Aware Design Methodology," International Symposium on Quality Electronic Design, 2006, pp. 807-812, the entire contents of which being herein incorporated by reference). Thus, the foregoing conventional models increase simulation errors, posing problems including an increased chip area and degraded circuit performance.

SUMMARY OF THE INVENTION

It is an object of the present invention to solve the foregoing problems by providing a circuit simulation method with minimized simulation errors.

In order to accomplish the object, a circuit simulation method according to the present invention uses a model parameter that takes into consideration effects on peripheral active regions arranged around a transistor.

Specifically, a circuit simulation method according to the present invention is drawn to a circuit simulation method for an integrated circuit that includes active regions isolated from each other by an isolation region. The active regions include a transistor active region having a gate electrode of a transistor formed thereon and at least one peripheral active region arranged around the transistor active region. The method includes: (a) generating a model parameter representing effects of stress upon the transistor active region caused by an interface between the transistor active region and the isolation region and an interface between the peripheral active region and the isolation region; and (b) evaluating characteristics of the transistor using a simulation program associated with the model parameter.

The circuit simulation method according to the present invention provides a circuit simulation that takes into consideration stress applied to a transistor active region and stress applied to a peripheral active region arranged around the transistor active region. This enables it to execute a circuit simulation with minimized simulation errors.

In the circuit simulation method according to the present invention, the model parameter preferably includes: width of the transistor active region; a term regarding width of the peripheral active region; and a term regarding width between the transistor active region and peripheral active region. This enables an accurate estimation of effects upon the transistor caused by stress.

In the circuit simulation method according to the present invention, preferably, the at least one peripheral active region contains at least one first peripheral active region being arranged to a side of the transistor active region in a gate length direction; and the model parameter includes a first parameter representing effects of stress applied to the transistor in the gate length direction. The first parameter preferably includes: a first active region width represented by a distance between an end of the gate electrode and an end of the transistor active region in the gate length direction; a first isolation region width represented by a distance between the transistor active region and the first peripheral active region; and a second active region width represented by width of the first peripheral active region in the gate length direction.

In this case, with the first parameter represented by $SA_{eff}$, $SA_{eff}$ is preferably represented by Equation 1:

$$SA_{eff} = SA + f(SL, SE) \qquad \text{(Equation 1)}$$

where SA denotes the first active region width, SL denotes the first isolation region width, SE denotes the second active region width, and f(SL, SE) denotes a function with SL and SE as arguments.

The first parameter is preferably represented by a polynomial including a term for a reciprocal of a value of the first active region width, a term for a reciprocal of a value of the first isolation region width, and a term for a reciprocal of a value of the second active region width.

With the first parameter represented by $SA_{eff}$, $SA_{eff}$ may be represented by Equation 2:

$$\frac{1}{SA_{eff}} = \frac{c1}{a+SA} - \frac{c2}{a+SA+SL} + \frac{c3}{a+SA+SL+SE} \qquad \text{(Equation 2)}$$

where c1, c2, and c3 denote weighting factors, "a" denotes a variable including a gate length of the transistor as a parameter, SA denotes the first active region width, SL denotes the first isolation region width, and SE denotes the second active region width. This enhances compatibility with conventional model parameters.

In the circuit simulation method according to the present invention, preferably, the at least one first peripheral active region includes a plurality of first peripheral active regions arranged in series at intervals; and the first parameter includes, as arguments, a first isolation region width for each first peripheral active region and a second active region width for each first peripheral active region. This enables an accurate estimation of effects on the transistor caused by a plurality of active regions.

In this case, with the first parameter represented by $SA_{eff}(n)$ when the number of the second active regions is n, $SA_{eff}(n)$ is preferably represented by an asymptotic equation shown at Equation 3:

$$\frac{1}{SA_{eff}(n)} = f(1/SA_{eff}(n-1)) \qquad \text{(Equation 3)}$$

Further, $SA_{eff}(n)$ is preferably represented by Equation 4:

$$\frac{1}{SA_{eff}(n)} = \frac{c1}{SA_{eff}(n-1)} - \frac{c2}{a+SA+\sum_{i=1}^{n} SLi} + \frac{c3}{a+SA+\sum_{i=1}^{n} SLi + \sum_{i=1}^{n} SEi} \qquad \text{(Equation 4)}$$

where c1, c2, and c3 denote weighting factors, "a" denotes a variable including a gate length as a parameter, SA denotes the first active region width, SLi denotes a width represented by a distance between an i-th second active region and an active region closer to the transistor than is the i-th second active region, and SEi denotes the width of the i-th second active region in the gate length direction.

In the circuit simulation method according to the present invention, preferably, the transistor active region includes at least two subregions having a difference in at least one of values of the first active region width, the first isolation region width, and the second active region width of each subregion; each subregion has a first subregion parameter representing effects of stress applied thereto; and the first parameter is represented by a sum of each subregion parameter.

In this case, with the first parameter represented by $SA_{eff}$, when the number of subregions included in the transistor active region is n, $SA_{eff}$ is represented by Equation 5:

$$\frac{1}{SA_{eff}} = \sum_{i=1}^{n} \frac{Wi}{W} \times \frac{1}{SA_{eff}(i)} \quad \text{(Equation 5)}$$

where $SA_{eff}(i)$ denotes a subregion parameter for an i-th subregion, W denotes width of the transistor active region in a gate width direction, and W(i) denotes width of the i-th subregion in the gate width direction.

In the circuit simulation method according to the present invention, preferably, the transistor includes a plurality of partial transistors connected in parallel; each partial transistor has a partial parameter representing effects of stress therein; and the first parameter is represented by an average of each partial parameter.

In this case, with the first parameter represented by $SA_{eff}$ when the number of the partial transistors is n, $SA_{eff}$ is represented by Equation 6:

$$\frac{1}{SA_{eff}} = \frac{1}{n} \sum_{i=1}^{n} \frac{1}{SA_{eff}(i)} \quad \text{(Equation 6)}$$

where $SA_{eff}(i)$ denotes a partial parameter for an i-th partial transistor.

In the circuit simulation method according to the present invention, preferably, the transistor active region has a first part arranged to one side of the gate electrode and a second part arranged to other side of the gate electrode; the first part has a first direction parameter representing effects of stress therein; the second part has a second direction parameter representing effects of stress therein; and the first parameter is represented by an average of the first direction parameter and the second parameter.

In this case, with the first parameter represented by $SA_{eff}$, $SA_{eff}$ is preferably represented by Equation 7:

$$\frac{1}{SA_{eff}} = \frac{1}{2} \times \left( \frac{c1}{SA_{eff}(1)} + \frac{c2}{SA_{eff}(2)} \right) \quad \text{(Equation 7)}$$

where c1 and c2 denote weighting factors, $SA_{eff}(1)$ denotes the first direction parameter, and $SA_{eff}(2)$ denotes the second direction parameter.

In the circuit simulation method according to the present invention, preferably, the at least one peripheral active region contains at least one second peripheral active region being arranged to a side of the transistor active region in a gate width direction; and the model parameter includes a second parameter representing effects of stress applied to the transistor in the gate width direction. The second parameter includes: a gate width of the transistor; a second isolation region width represented by a distance between the transistor active region and the second peripheral active region; and a third active region width represented by width of the second peripheral active region in the gate width direction.

In this case, with the second parameter represented by $SY_{eff}$, $SY_{eff}$ is preferably represented by Equation 8:

$$\frac{1}{SY_{eff}} = \frac{c1}{b} - \frac{c2}{b+SW} + \frac{c3}{b+SW+SF} \quad \text{(Equation 8)}$$

where c1, c2, and c3 denote weighting factors, "b" denotes a variable including a gate width of the transistor as a parameter, SW denotes the second isolation region width, and SF denotes the third active region width.

In the circuit simulation method according to the present invention, the at least one peripheral active region contains at least one first peripheral active region being arranged to a side of the transistor active region in a gate length direction; the at least one peripheral active region contains at least one second peripheral active region being arranged to a side of the transistor active region in a gate width direction; the model parameter includes a first parameter representing effects of stress applied to the transistor in a gate length direction and a second parameter representing effects of stress applied to the transistor in a gate width direction. The first parameter is preferably represented by an equation including arguments including: a first active region width represented by a distance between an end of the gate electrode and an end of a first active region in the gate length direction; a first isolation region width represented by a distance between the first peripheral active region and the transistor active region; and a second active region width represented by width of the first peripheral active region in the gate length direction. The second parameter preferably includes: a gate width of the transistor; a second isolation region width represented by a distance between the second peripheral active region and the first active region; and a third active region width represented by width of the second peripheral active region in the gate width direction.

In this case, with the model parameter represented by $SAY_{eff}$, $SAY_{eff}$ is preferably represented by Equation 9:

$$\frac{1}{SAY_{eff}} = \frac{\alpha_A}{SA_{eff}} + \frac{\alpha_Y}{SY_{eff}} \quad \text{(Equation 9)}$$

where $\alpha_A$ and $\alpha_Y$ denote weighting parameters, $SA_{eff}$ denotes the first parameter, and $SY_{eff}$ denotes the second parameter.

With the first parameter represented by $SA_{eff}$ and the second parameter represented by $SY_{eff}$, $SA_{eff}$ may be represented by Equation 10 and $SY_{eff}$ may be represented by Equation 11:

$$\frac{1}{SA_{eff}} = \sum_{line} \int_{along\ the\ line} \frac{d\zeta}{\zeta} \times \frac{\cos\theta}{r} \times \lambda \quad \text{(Equation 10)}$$

$$\frac{1}{SY_{eff}} = \sum_{line} \int_{along\ the\ line} \frac{d\zeta}{\zeta} \times \frac{\sin\theta}{r} \times \lambda \quad \text{(Equation 11)}$$

where $\zeta$ denotes a point on an interface between the isolation region and an active region arranged around the transistor, $d\xi$ denotes a small region in the interface including C, r denotes the length of a straight line connecting ξ and the center of a channel region of the transistor, θ denotes an angle between the gate length direction and a direction of extending of the straight line connecting ξ and the center of the channel region of the transistor, and λ denotes a coefficient denoting orientation of stress applied to the interface.

In the circuit simulation method according to the present invention, preferably, the characteristics of the transistor include carrier mobility, threshold voltage, and saturated carrier velocity.

The circuit simulation method according to the present invention preferably further includes (c) acquiring data regarding arrangement and shape of the transistor, wherein the model parameter is determined on the basis of the data of the transistor.

A circuit simulation apparatus according to the present invention is drawn to an apparatus for simulating an integrated circuit that includes active regions isolated from each other by an isolation region, the active regions including a transistor active region having a gate electrode of a transistor formed thereon and at least one peripheral active region arranged around the transistor active region. The apparatus includes: a model parameter generation unit for generating a model parameter representing effects of stress upon the transistor active region caused by the isolation region; and a simulation execution unit for evaluating characteristics of the transistor using a simulation program associated with the model parameter. The model parameter includes: a term regarding width of the transistor active region; a term regarding width of the peripheral active region; and a term regarding width between the transistor active region and the peripheral active region.

The circuit simulation apparatus according to the present invention provides a simulation that takes into consideration effects on peripheral active regions arranged around a transistor. Thus, the circuit simulation apparatus realized carries out a circuit simulation with minimized simulation errors.

DESCRIPTION OF THE PREFERRED EMBODIMENTS

First Embodiment

Figure 1:
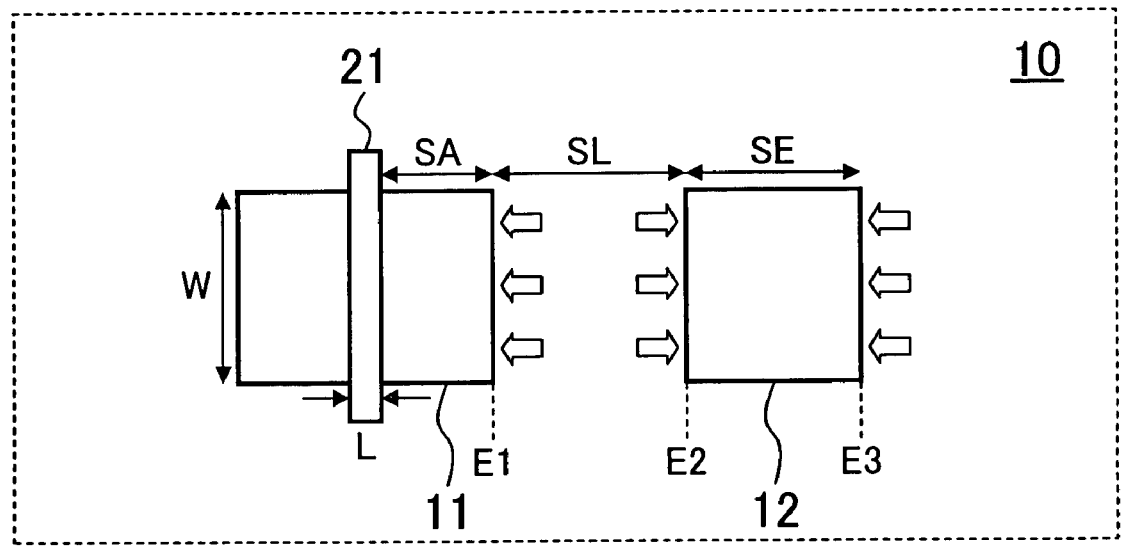
FIG. 1 is a plan view of an integrated circuit for illustrating a simulation method according to a first embodiment of the present invention.

A first embodiment of the present invention will be described in conjunction with the drawings. FIG. 1 shows a layout pattern of an integrated circuit for which a simulation method according to the first embodiment can be implemented. A first active region (transistor active region) 11 and a second active region (first peripheral active region) 12 are provided apart from one another. The first active region 11 and the second active region 12 are isolated from one another by a shallow trench isolation (STI) region 10 of an insulation film. The first active region 11 is provided with a gate electrode 21 formed with an insulation film in between, the gate electrode 21 extending in parallel with the second active region 12. The first active region 11 and the gate electrode 12 constitute an MIS (Metal-Insulator-Semiconductor) FET (Field Effect Transistor), including a channel region formed in a lower portion of the gate electrode 21 in the first active region 11.

Even if the gate length L and gate width W of the gate electrode 21 are the same, the electrical characteristics of the MISFET will not be the same in the two dimensions, because of effects of distortion at the channel region of the MISFET. The size of distortion at the channel region of the MISFET is determined by stress on the MISFET from the STI region. An interface E1 between the first active region 11 and the STI region 10 receives stress resulting from a difference in heat expansion coefficient between the active region and the STI region. It is likely that the size of effects on the channel region of the MISFET caused by stress applied to the interface E1 is inversely proportionate to the distance between the interface E1 and the channel region of the MISFET. Therefore, stress applied to the channel region of the MISFET can be represented by a function of the first active region width SA, which is the distance between an end of the gate electrode 21 and an end of the first active region 11 in the gate length direction. As shown in FIG. 1, however, when the second active region 12 is present adjacent the MISFET, effects of stress on the adjacent active region is not ignorable.

Stress applied to an interface E2, among the boundaries between the second active region 12 and the STI region 10, that is located against the MISFET (the first active region 11) serves as pulling stress against the channel region of the MISFET. Stress applied to an interface E3, among the boundaries between the second active region 12 and the STI region 10, that is located on the other side of the MISFET-facing interface E2 serves as compressive stress against the channel region of the MISFET. It is likely that the sizes of effects on the channel region of the MISFET caused by stress applied to the interface E2 and stress applied to the interface E3 are inversely proportionate to the distance between the channel region and the interface E2 and the distance between the channel region and the interface E3, respectively. Therefore, effects of stress on the channel of the MISFET can be represented by a function of the distance between the channel region and the interface E1, the distance between the channel region and the interface E2, and the distance between the channel region and the interface E3. That is, the representative function is f1(SA, SL, SE), where SA denotes the first active region width, SL denotes the distance between the first active region 11 and the second active region 12, i.e., the width of a first isolation region, and SE denotes the width of the second active region 12. Specifically, as a model parameter representing effects of stress on the channel region of the MISFET, an effective active region width (first parameter) $SA_{eff}$ can be defined by Equation 12:

$$\frac{1}{SA_{eff}} = \frac{c1}{a+SA} - \frac{c2}{a+SA+SL} + \frac{c3}{a+SA+SL+SE} \quad \text{(Equation 12)}$$

On the right side of Equation 12, the first term denotes effects of stress applied to the interface E1, the second term denotes effects of stress applied to the interface E2, and the third term denotes effects of stress applied to the interface E3. Since stress applied to the interface E2 serves as pulling stress against the channel region of MISFET, a minus sign is placed before the second term.

In Equation 12, "a" denotes a parameter regarding the gate length L. For example, the parameter may be the product of the gate length L and a coefficient of 0.5, in order to represent effects of stress on the center line of the gate electrode 21. Alternatively, the gate length L may be ignored by setting the coefficient to 0, in which case the model parameter is not essentially influenced.

Also, c1, c2, and c3 denote weighting factors; for example, a parameter having the width of the isolation region as an argument may be used. When there is no need for weighting, the weighting factors may be set to 1.

Figure 2:
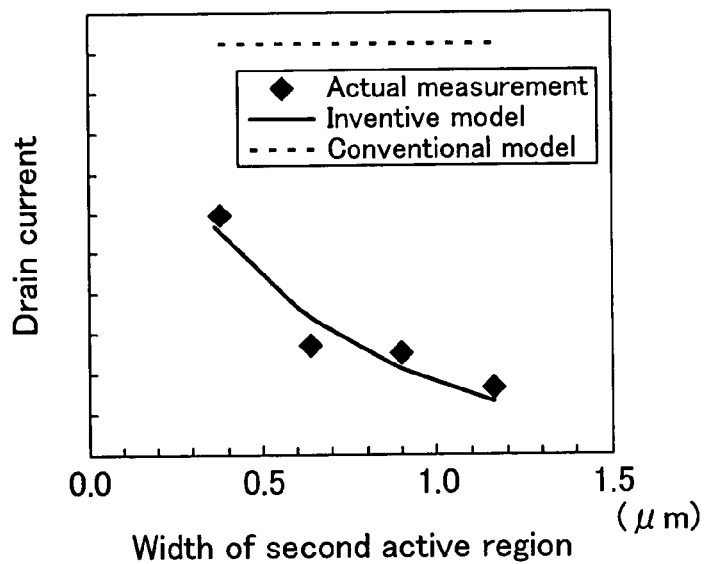
FIG. 2 is a graph that compares the results provided by the simulation method according to the first embodiment of the present invention with actual measurements.
Figure 3:
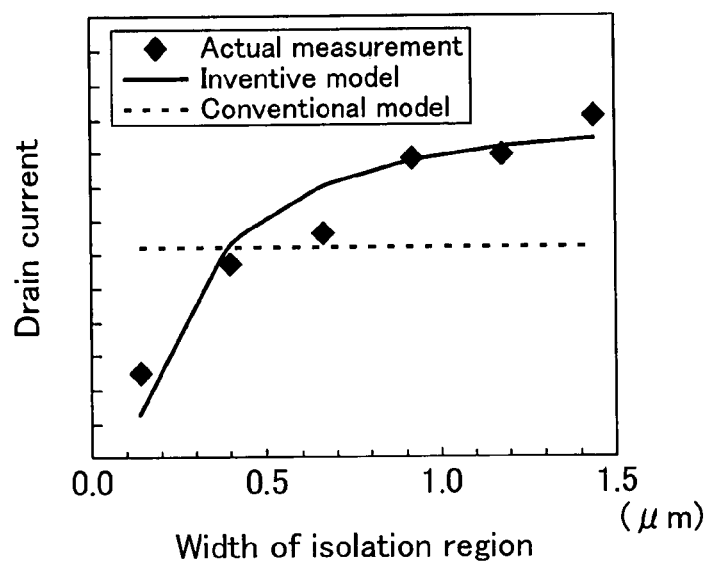
FIG. 3 is a graph that compares the results provided by the simulation method according to the first embodiment of the present invention with actual measurements.

FIGS. 2 and 3 compare electrical characteristics of transistors obtained by simulation and the actual characteristics of the transistors. FIG. 2 shows the measurements of drain current on various p-type MISFETs with different widths SE for the second active region 12, while the gate lengths L, the gate widths W, the first active region widths SA, and the isolation region widths SL are equal. As shown in FIG. 2, as the width SE of the second active region 12 becomes larger, the drain current on MISFET decreases. Conventional circuit simulations using a model parameter that takes into consideration only effects of the first active region width SA cannot reflect effects of the adjacent second active region 12, thereby causing large simulation errors. Meanwhile, it can be seen that in the circuit simulation using the model parameter according to this embodiment, effects of the width SE of the adjacent second active region are simulated with accuracy.

FIG. 3 shows the results of the case of varied isolation region widths SL with the width SE of the second active region 12 being constant. For the actual p-type MISFETs, as the width SL of the isolation region becomes larger, the drain current increases. Circuit simulations using a conventional model parameter cannot reflect effects of the width SL of the isolation region, thereby causing large simulation errors. Meanwhile, it can be clearly seen that the simulation using the model parameter of this embodiment provides a good agreement between the simulated characteristics and the actual characteristics of MISFET, thus realizing a highly accurate simulation.

The model parameter of this embodiment is also superior in compatibility with a conventional BSIM4 model. Assume that there are three extreme situations. Then, there is a smooth continuance from the function shown at Equation 12 to the conventional model. For example, when the isolation region width SL is unlimitedly large, i.e., when there is substantially no second active region 12, then the second and third terms on the right side of Equation 12 cancel one another out, resulting in the conventional model. When the isolation region width SL is zero, i.e., when there is no STI region 10 between the first active region 11 and the second active region 12 thereby making the first active region width substantially (SA+SE), then the first and second terms on the right side of Equation 12 cancel one another out, resulting in the conventional model. Further when the width SE of the second active region 12 is zero, i.e., there is no second active region 12, then the second and third terms on the right side of Equation 12 cancel one another out, resulting in the conventional model.

Figure 4:
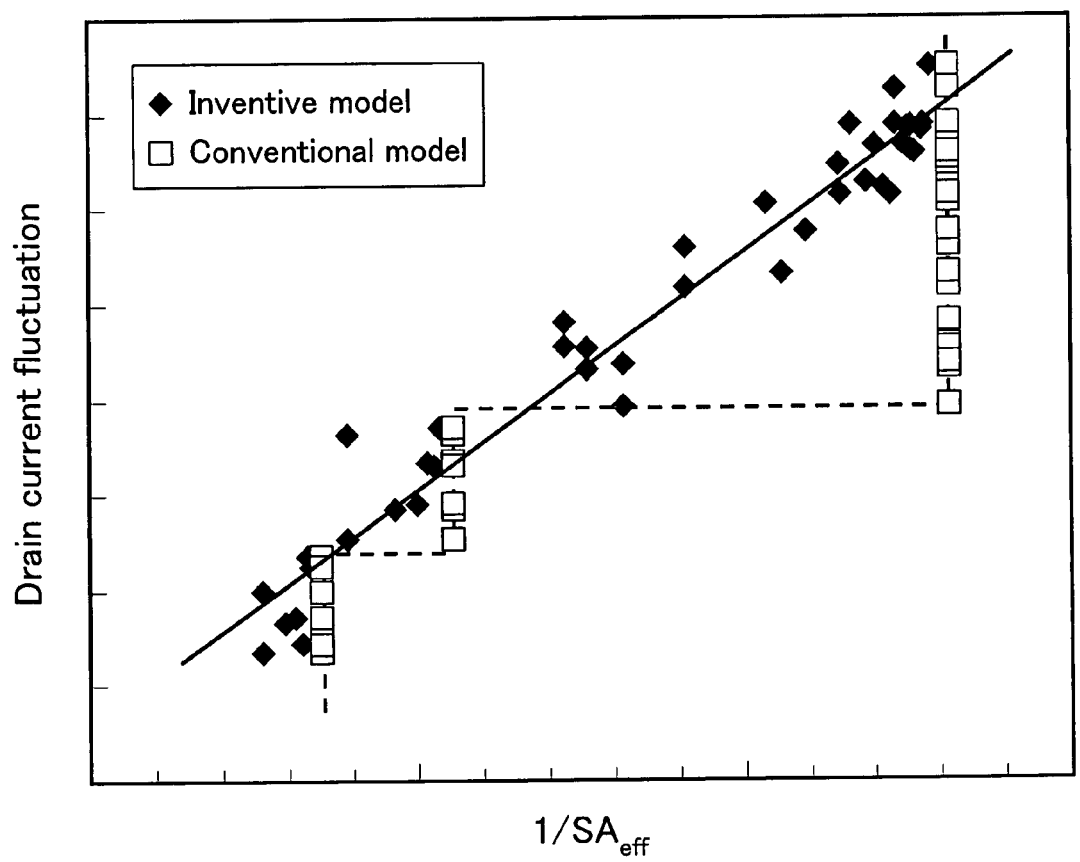
FIG. 4 is a graph that compares the results provided by the simulation method according to the first embodiment of the present invention with a conventional simulation method.

FIG. 4 shows the actual measurements of drain current with the width SA of the first active region 11, the isolation region width SL, and the width SE of the second active region 12 as variables. In p-channel type MISFET, threshold voltage etc. has low stress dependency, and thus the amount of fluctuation of drain current should be proportionate to stress. That is, if $1/SA_{eff}$ provides correct modeling of stress, the drain current should be proportionate to $1/SA_{eff}$. In the model of the present invention, the effective active region width $SA_{eff}$ is represented using the width SA of the first active region 11, the isolation region width SL, and the width SE of the second active region 12. This provides correct modeling of stress applied to MISFET in the case of varying the isolation region width SL and the width SE of the second active region 12, thus enabling the proportional relationship between the drain current and $1/SA_{eff}$ to be observed. The conventional BSIM4 model, on the contrary, provides modeling of the effective active region width $SA_{eff}$ as a function of the first active region width SA alone, making it impossible for $1/SA_{eff}$ to provide correct modeling of stress in the case of varying the isolation region width SL and the width SE of the second active region 12.

Other possible models include $SA_{eff}$=SA+f2(SL,SE), which is for the case where another active region is present adjacent the active region with the MISFET. This case involves a decrease in stress applied to the channel region of the MISFET, and the decrease is taken as an increase in the effective active region width. The function f2 contains, as arguments, the gate length L, the gate width W, and the first active region width SA, though implicitly.

While the second active region shown in FIG. 1 is simply an active region, the second active region may be a transistor active region or a diode active region, in which case there is nothing problematic to modeling.

Second Embodiment

Figure 5:
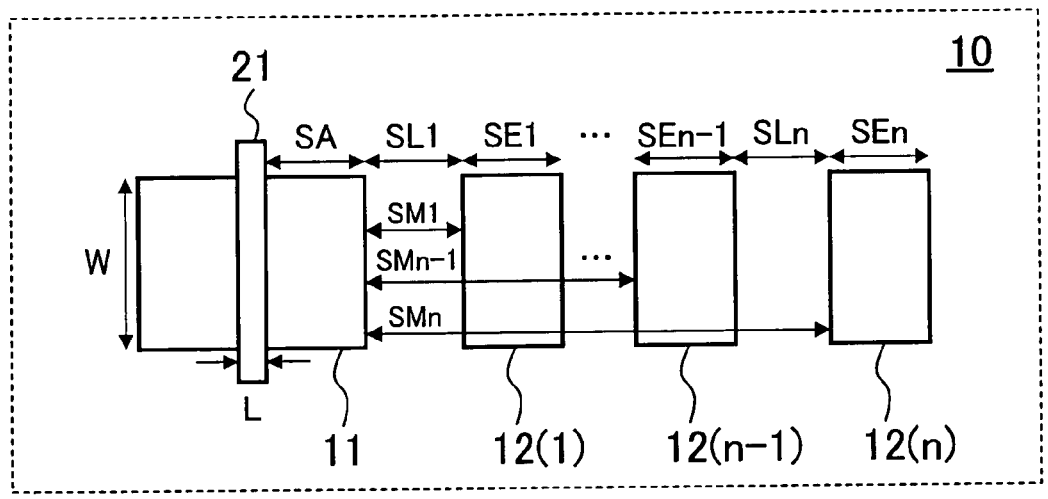
FIG. 5 is a plan view of an integrated circuit for illustrating a simulation method according to a second embodiment of the present invention.

A second embodiment of the present invention will be described below in conjunction with the drawings. FIG. 5 shows a layout pattern of an integrated circuit for illustrating a simulation method according to the second embodiment. The second embodiment is drawn to the case of providing a plurality of second active regions.

Here effects on the channel region of MISFET caused by stress applied to the peripheries of the second active regions are added. The effective active region width $SA_{eff}$ when there are n second active regions can be represented by Equation 13:

$$\frac{1}{SA_{eff}} = \frac{c1}{a+SA} - \sum_{i=1}^{n} \frac{c2i}{a+SA+SMi} + \sum_{i=1}^{n} \frac{c3i}{a+SA+SMi+SEi} \quad \text{(Equation 13)}$$

where c1, c2i, and c3i denote weighting factors, SMi denotes the distance between the first active region 11 and i-th second active region $12_{(i)}$, and SEi denotes the width of the i-th second active region $12_{(i)}$.

Also, $SA_{eff}$ can be defined as a function of $SL_1, SL_2 \ldots SL_n$, and $SE_1, SE_2 \ldots SEn$, where $SL_1$ denotes the width of the isolation region between the first active region 11 and a first second-active region $12_{(1)}$, $SL_2$ denotes the width of the isolation region between the first second-active region $12_{(1)}$ and a second second-active region $12_{(2)}$, and the width of the isolation region between a (n−1)-th second active region $12_{(n-1)}$ and an n-th second active region $12_{(n)}$.

This can be represented by, as an extension of Equation 12, the following equation:

$$\frac{1}{SA_{\mathit{eff}}} = \frac{c1}{a+SA} - \frac{c2}{a+SA+SL1} + \frac{c3}{a+SA+SL1+SE1} - \frac{c4}{a+SA+SL1+SE1+SL2} + \frac{c5}{a+SA+SL1+SE1+SL2+SE2} \quad \text{(Equation 14)}$$

Further, Equation 14 can be expressed in the following asymptotic equation using the effective active region width $SA_{\mathit{eff}}(n-1)$, which is for the case where the number of the second active regions is (n−1).

$$\frac{1}{SA_{\mathit{eff}}(n)} = \frac{c1}{SA_{\mathit{eff}}(n-1)} - \frac{c2}{a+SA+\sum_{i=1}^{n}SLi} + \frac{c3}{a+SA+\sum_{i=1}^{n}SLi+\sum_{i=1}^{n}SEi} \quad \text{(Equation 15)}$$

Use of Equation 15 provides a circuit simulation that takes into consideration effects of a plurality of second active regions.

While Equation 15 is an extension of Equation 12, Equation 12 is not used for limiting purposes but $SA_{\mathit{eff}}(n)=f3(SA_{\mathit{eff}}(n-1))$ generally applies.

Effects on the channel region of MISFET caused by an active region(s) other than that of the MISFET become weaker as the active region(s) is apart from the MISFET. In view of this, an area to consider is determined in accordance with required simulation accuracy, and an active region(s) within the area is considered. For example, the area to consider is set so that the area extends radially 2 μm from the center of the channel of the MISFET.

Third Embodiment

Figure 6:
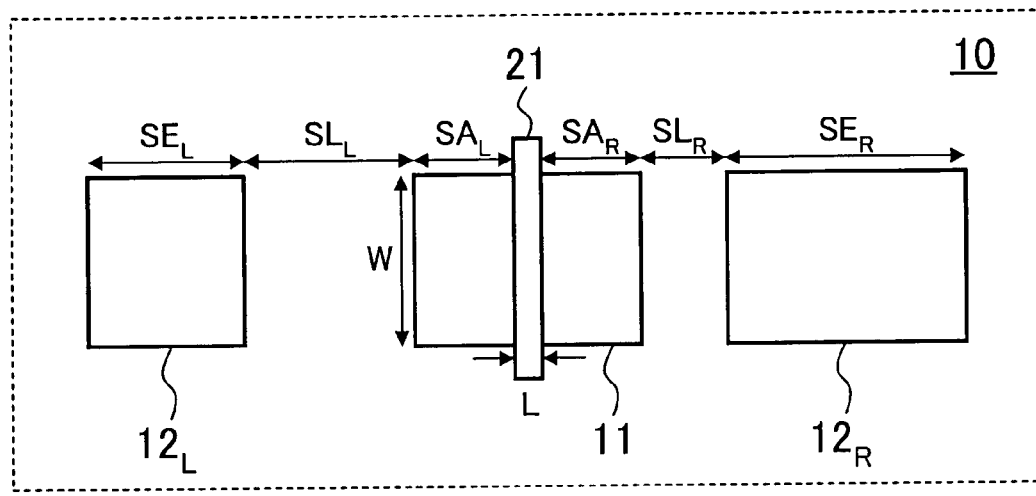
FIG. 6 is a plan view of an integrated circuit for illustrating a simulation method according to a third embodiment of the present invention.

A third embodiment of the present invention will be described below in conjunction with the drawings. FIG. 6 shows a layout pattern of an integrated circuit for illustrating a simulation method according to the third embodiment. The layout pattern to which the third embodiment is drawn has two second active regions each arranged on each side of MISFET in the gate length direction. Here effects of stress applied to the MISFET can be represented by an average of effects of stress applied to the MISFET from the right direction and effects of stress applied to the MISFET from the left direction.

With $SA_{\mathit{eff}}(1)$ representing a first direction parameter denoting effects of stress applied to the MISFET from the right direction and $SA_{\mathit{eff}}(2)$ representing a second direction parameter denoting effects of stress applied to the MISFET from the left direction, $SA_{\mathit{eff}}(1)$ and $SA_{\mathit{eff}}(2)$ can be respectively represented by Equation 16 and Equation 17:

$$\frac{1}{SA_{\mathit{eff}}(1)} = \frac{1}{a+SA_R} - \frac{1}{a+SA_R+SL_R} + \frac{1}{a+SA_R+SL_R+SE_R} \quad \text{(Equation 16)}$$

$$\frac{1}{SA_{\mathit{eff}}(2)} = \frac{1}{a+SA_L} - \frac{1}{a+SA_L+SL_L} + \frac{1}{a+SA_L+SL_L+SE_L} \quad \text{(Equation 17)}$$

where $SA_R$ denotes the width of the right part of the first active region 11, $SA_L$ denotes the width of the left part of the first active region 11, $SL_R$ denotes the distance between the first active region 11 and a second active region $12_R$ arranged on the right side, $SL_L$ denotes the distance between the first active region 11 and a second active region $12_L$ arranged on the left side, $SE_R$ denotes the width of the second active region $12_R$ arranged on the right side, and $SE_L$ denotes the width of the second active region $12_L$ arranged on the left side.

For a symmetric layout, $SA_{\mathit{eff}}(1)$ and $SA_{\mathit{eff}}(2)$ are identical, and thus only one of the second active regions needs to be considered, in the manner described in the first embodiment. When $SA_{\mathit{eff}}(1)$ and $SA_{\mathit{eff}}(2)$ differ from one another, an average of a reciprocal of the first direction parameter and a reciprocal of the second direction parameter is obtained as shown in Equation 18:

$$\frac{1}{SA_{\mathit{eff}}} = \frac{1}{2} \times \left( \frac{c1}{SA_{\mathit{eff}}(1)} + \frac{c2}{SA_{\mathit{eff}}(2)} \right) \quad \text{(Equation 18)}$$

where c1 and c2 denote weighting factors.

When a plurality of second active regions are arranged on both sides of the MISFET, effects of the plurality of second active regions are added, as in the second embodiment.

Fourth Embodiment

Figure 7:
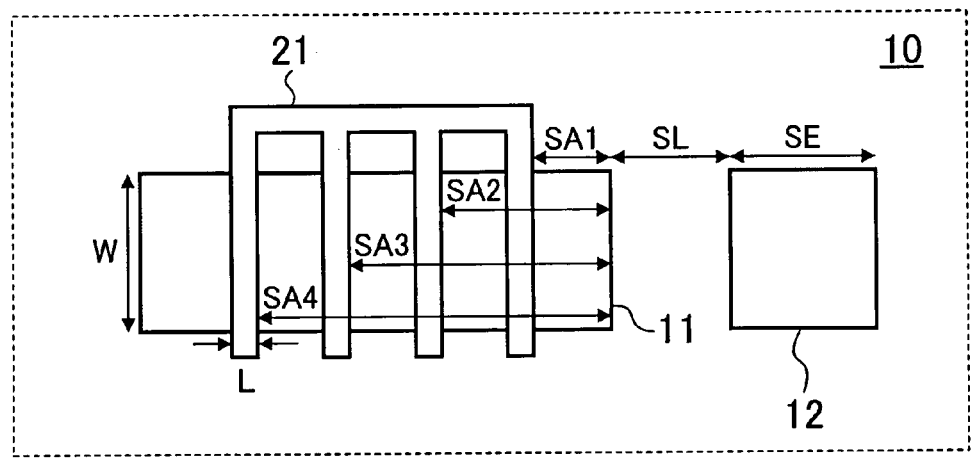
FIG. 7 is a plan view of an integrated circuit for illustrating a simulation method according to a fourth embodiment of the present invention.

A fourth embodiment of the present invention will be described below in conjunction with the drawings. FIG. 7 shows a layout pattern of an integrated circuit for illustrating a simulation method according to the fourth embodiment.

This embodiment is drawn to the case of a parallel transistor such that the MISFET has a plurality of gate electrodes 21, and a plurality of partial transistors are connected to each other in parallel. Here an average of the effective active region widths of the partial transistors (partial parameters) is set to be the effective active region width of the MISFET as a whole.

For example, when the parallel transistor is composed of four partial transistors as shown in FIG. 7, each of the first active region widths of the partial transistors is represented by SA1, SA2, SA3, or SA4, and the effective active region width is defined in the same manner as in the first embodiment. Then, an average of the effective active region widths of the partial transistors is set to be the effective active region width of the MISFET as a whole. When the number of the partial transistors is n, the effective active region width of the MISFET as a whole can be represented by Equation 19:

$$\frac{1}{SA_{eff}} = \frac{1}{n}\sum_{i=1}^{n}\frac{1}{SA_{eff}(i)} \quad \text{(Equation 19)}$$

The effective active region width of each partial transistor may be defined using Equation 15 or Equation 18, instead of Equation 12.

Fifth Embodiment

Figure 8:
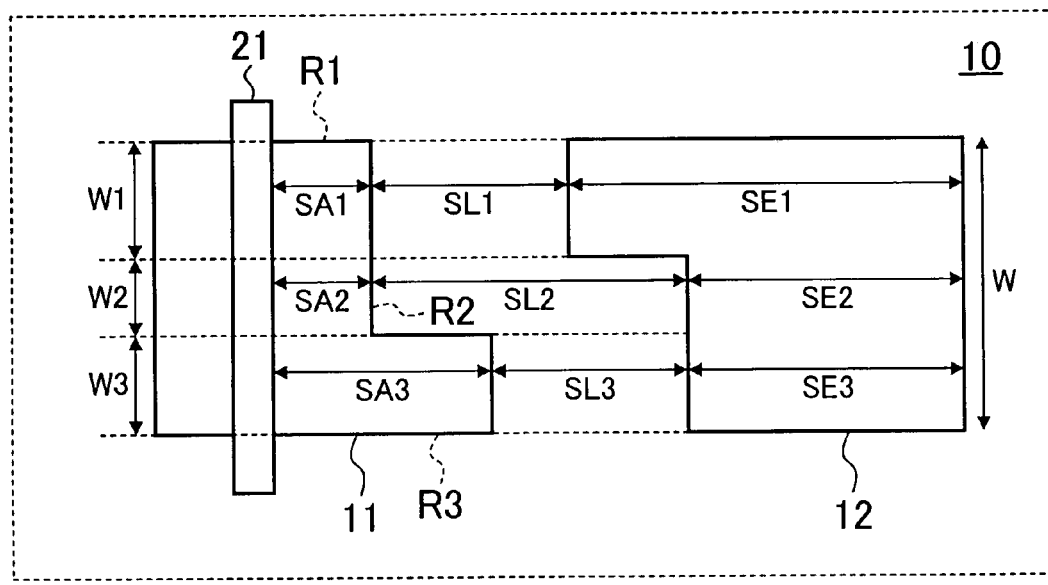
FIG. 8 is a plan view of an integrated circuit for illustrating a simulation method according to a fifth embodiment of the present invention.

A fifth embodiment of the present invention will be described below in conjunction with the drawings. FIG. 8 shows a layout pattern of an integrated circuit for illustrating a simulation method according to the fifth embodiment.

In the layout pattern of this embodiment, the first active region 11 and the adjacent second active region 12 of MISFET are not rectangular; each have more than four vertices. In this case, the first active region width has different values, the isolation region width has different values, and the second active region width has different values along the gate width direction. In view of this, the active region with the MISFET is divided into subregions where the values of SA are the same, the values of SL are the same, and the values of SE are the same. Then, the effective active region widths (subregion parameters) $SA_{eff}(i)$ of the divided subregions are obtained and added together.

For example, in FIG. 8, the active region is divided into three subregions, R1, R2, and R3. In the subregion R1, the first active region width is SA1, the isolation region width is SL1, and the second active region width is SE1. Likewise, in the subregion R2, the first active region width is SA2, the isolation region width is SL2, and the second active region width is SE2. Likewise, in the subregion R3, the first active region width is SA3, the isolation region width is SL3, and the second active region width is SE3. Thus, the effective active region width $SA_{eff}(1)$ of the subregion R1 can be defined by a function of SA1, SL1, and SE1. Likewise, the effective active region width $SA_{eff}(2)$ of the subregion R2 can be defined by a function of SA2, SL2, and SE2. Likewise, the effective active region width $SA_{eff}(3)$ of the subregion R3 can be defined by a function of SA3, SL3, and SE3.

The width of the subregion R1 in the gate width direction is W1, that of the subregion R2 is W2, and that of the subregion R3 is W3. Thus, the effective active region width of the MISFET as a whole can be represented by an average of the first active region widths of the divided regions weighted depending on the width of each region. When the number of the divided regions is n, the effective active region width of the MISFET as a whole can be represented by Equation 20:

$$\frac{1}{SA_{eff}} = \sum_{i=1}^{n}\frac{Wi}{W}\times\frac{1}{SA_{eff}(i)} \quad \text{(Equation 20)}$$

Also when there are a plurality of second active regions and when a second active region is arranged on both sides of the MISFET in the gate length direction, the effective active region width can be defined in the above manner.

Sixth Embodiment

Figure 9:
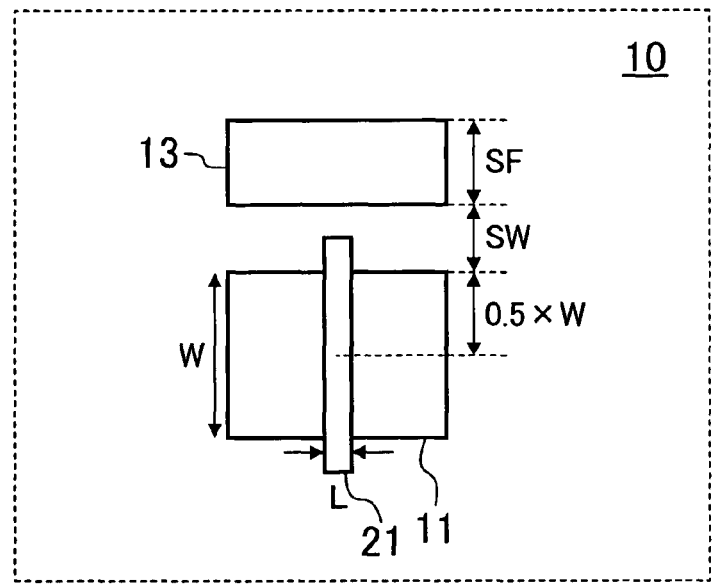
FIG. 9 is a plan view of an integrated circuit for illustrating a simulation method according to a sixth embodiment of the present invention.

A sixth embodiment of the present invention will be described below in conjunction with the drawings. FIG. 9 shows a layout pattern of an integrated circuit for illustrating a simulation method of the sixth embodiment.

This embodiment is drawn to the case where a third active region (second peripheral active region) 13 is provided adjacent MISFET in the gate width direction. The width of the first active region 11 in the gate width direction is represented by W, the width of an STI region between the first active region 11 and the third active region 13 is represented by SW, and the width of the third active region, which is adjacent the MISFET in the gate width direction, is represented by SF A model parameter (second parameter) $SY_{eff}$, which characterizes stress in the gate width direction, can be generated using the width W of the first active region 11 in the gate width direction, the isolation region width SW in the gate width direction, and the width SF of the third active region 13, as in the case of an adjacent active region in the gate length direction. Specifically, the model parameter $SY_{eff}$ can be represented by Equation 21:

$$\frac{1}{SY_{eff}} = \frac{c1}{b} - \frac{c2}{b+SW} + \frac{c3}{b+SW+SF} \quad \text{(Equation 21)}$$

where b denotes a variable with the gate width W as a parameter, usually 0.5×W.

Use of $SY_{eff}$ for circuit simulation enables modeling of carrier mobility, saturated carrier velocity, threshold voltage, drain current, etc.

In the case of a plurality of third active regions and in the case of a third active region provided on both sides of the MISFET in the gate width direction, a model parameter in the gate width direction can be generated in the same manner as in the second embodiment and the third embodiment.

Seventh Embodiment

Figure 10:
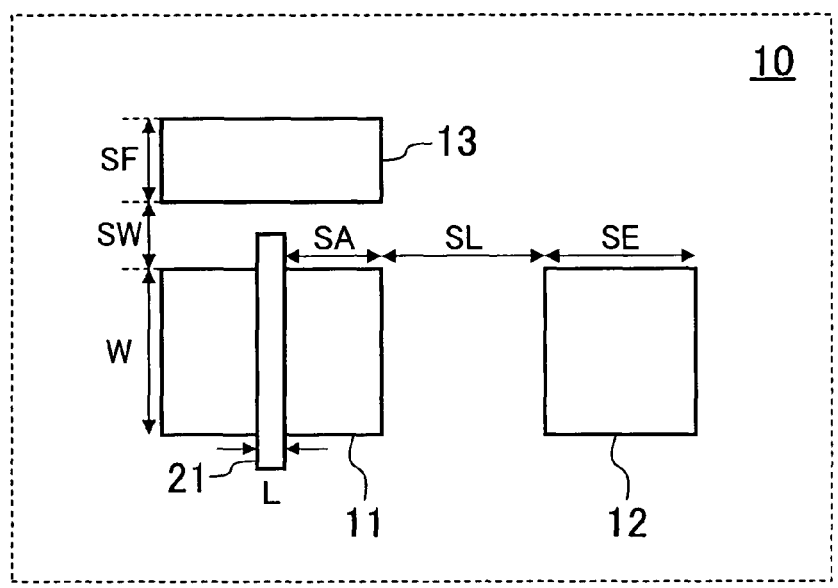
FIG. 10 is a plan view of an integrated circuit for illustrating a simulation method according to a seventh embodiment of the present invention.

A seventh embodiment of the present invention will be described below in conjunction with the drawings. FIG. 10 shows a layout pattern of an integrated circuit for illustrating a simulation method according to the seventh embodiment.

This embodiment is drawn to the case where a second active region 12 is provided adjacent MISFET in the gate length direction, and a third active region 13 is provided adjacent the MISFET in the gate width direction.

Here a model parameter $SAY_{eff}$, which characterizes stress in the gate length direction and in the gate width direction, can be generated by weighting a model parameter (first parameter) $SA_{eff}$ characterizing stress in the gate length direction and a model parameter (second parameter) $SY_{eff}$ characterizing stress in the gate width direction and adding the weighted model parameters. Specifically, the model parameter $SAY_{eff}$ can be represented by Equation 22:

$$\frac{1}{SAY_{eff}} = \frac{\alpha_A}{SA_{eff}} + \frac{\alpha_Y}{SY_{eff}} \quad \text{(Equation 22)}$$

where $\alpha_A$ and $\alpha_Y$ denote weighting factors. While $\alpha_A$ and $\alpha_Y$ need to be adjusted depending on a process, the initial values may be determined using a ratio of piezo resistance coefficient. For example, in the case of a (110) channel n-type MISFET, the ratio may be $\alpha_A/\alpha_Y=3.2/1.8$.

Eighth Embodiment

Figure 11:
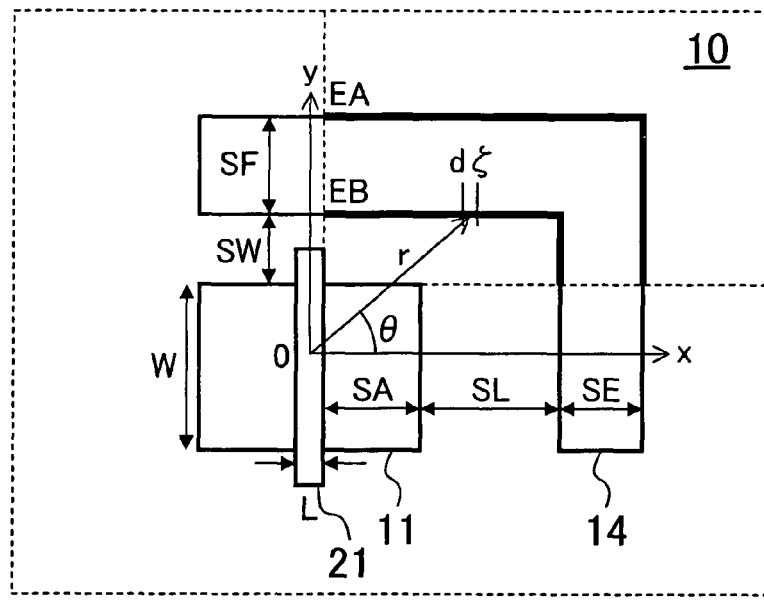
FIG. 11 is a plan view of an integrated circuit for illustrating a simulation method according to an eighth embodiment of the present invention.

An eighth embodiment of the present invention will be described below. FIG. 11 shows a layout pattern of an integrated circuit for illustrating a simulation method according to the eighth embodiment.

This embodiment is drawn to the case where a fourth active region 14 with an L-shaped plan view is provided, and the channel of MISFET is influenced by stress in an oblique direction, instead of the gate length direction and the gate width direction.

An origin O is determined on the MISFET, an x axis is taken in the gate length direction, and a y axis is taken in the gate width direction. The interface between the fourth active region 14 and the STI region 10 located adjacent the MISFET is an interface EB, and the interface between the fourth active region 14 and the STI region 10 located further distanced from the MISFET is an interface EA. The boundaries EA and EB each include a small distance $d\zeta$ including an arbitrary point $\xi$, and the angle between the x axis and a straight line r connecting $\xi$ and the origin O of the MISFET is $\theta$. The origin O of the MISFET may be the center of the channel region of the MISFET.

In this case, a model parameter (first parameter) $SA_{eff}$ that characterizes stress in the gate length direction and a model parameter (second parameter) $SY_{eff}$ that characterizes stress in the gate width direction are respectively represented by Equations 23 and 24:

$$\frac{1}{SA_{eff}} = \sum_{line} \int_{along\ the\ line} \frac{d\zeta}{\zeta} \times \frac{\cos\theta}{r} \times \lambda \qquad \text{(Equation 23)}$$

$$\frac{1}{SY_{eff}} = \sum_{line} \int_{along\ the\ line} \frac{d\zeta}{\zeta} \times \frac{\sin\theta}{r} \times \lambda \qquad \text{(Equation 24)}$$

Alternatively, a model parameter $SAY_{eff}$ may be generated by combining Equations 23 and 24 with Equation 22.

Further, the case where a plurality of fourth active regions are provided can be modeled by an extension of Equations 23 and 24.

Ninth Embodiment

Figure 12:
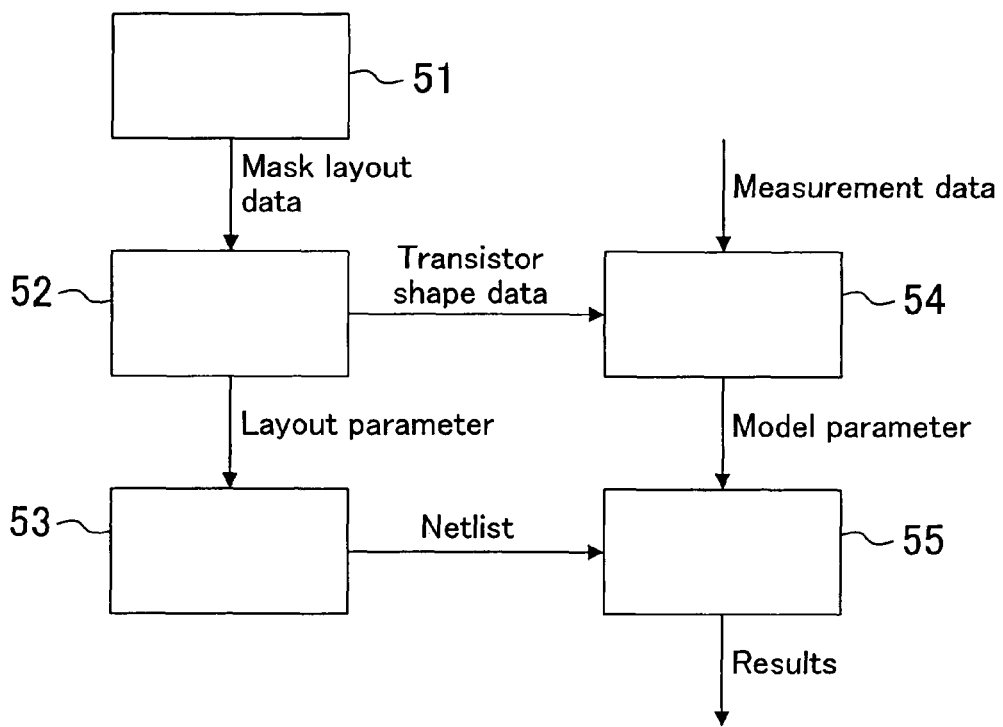
FIG. 12 is a block diagram showing a simulation apparatus according a ninth embodiment of the present invention.
Figure 13:
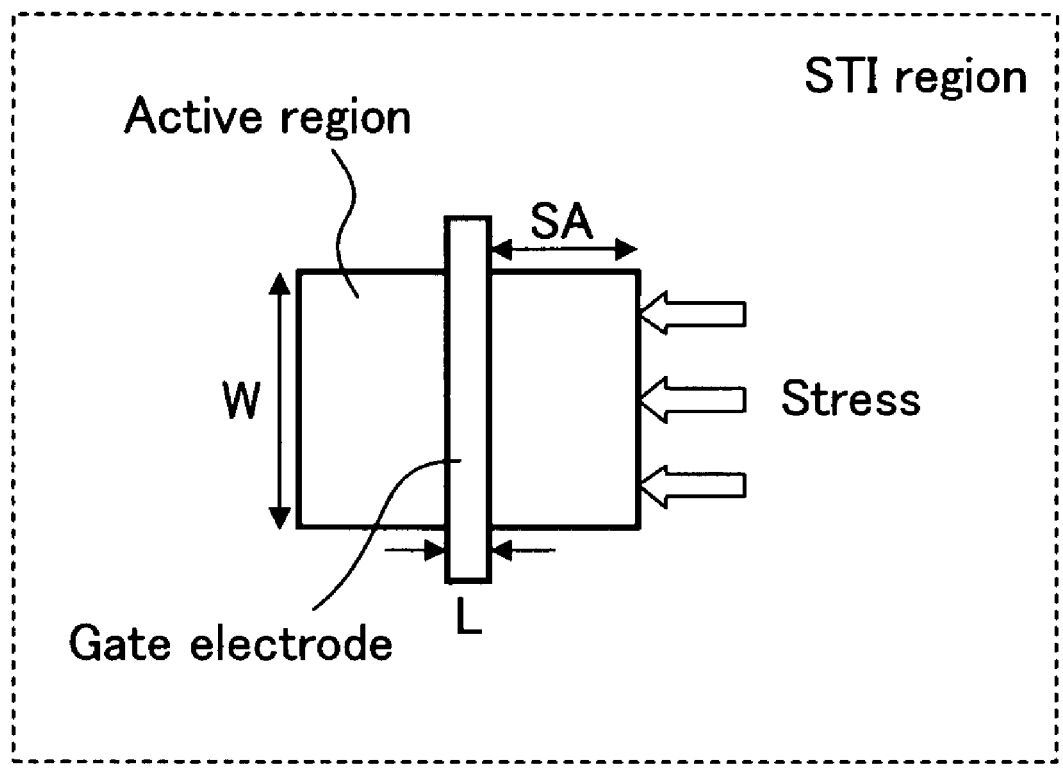
FIG. 13 is a plan view of an integrated circuit for illustrating a simulation method according to a conventional example.

A ninth embodiment of the present invention will be described below in conjunction with the drawings. FIG. 12 shows a block diagram of a simulation apparatus according to the ninth embodiment.

Mask layout data stored in a mask layout data storing unit 51 is transmitted to a transistor shape recognition unit 52. The transistor shape recognition unit 52 extracts data regarding transistor shape and a characteristic layout parameter (data regarding transistor arrangement). The layout parameter is transmitted to a netlist generation unit 53, which generates a netlist based on the layout parameter. The data regarding transistor shape and the like includes the gate length and gate width of the MISFET, the size and shape of an active region with the MISFET, the size and shape of an active region arranged adjacent the MISFET, and width and shape of an isolation region, and is transmitted to a model parameter generation unit 54. The model parameter generation unit 54 generates, from the data regarding transistor shape and measurement data such as TEG (Test Element Group), a model parameter that takes into consideration the isolation region width and the active region adjacent the MISFET. The netlist and the model parameter are transmitted to a circuit simulation execution unit 55, which evaluates electrical characteristics of a circuit to be simulated including carrier mobility, threshold voltage, and saturated carrier velocity of MISFET, followed by output of the results.

For the circuit simulation execution unit 55, the main body of a conventional circuit simulator represented by SPICE may be used. The simulation apparatus of this embodiment generates a model parameter that takes into consideration the width of the isolation region and the width of an active region adjacent the MISFET on the basis of mask layout data and measurement data, thereby enabling a circuit simulation with high accuracy.

Also, a model parameter is generated having high compatibility with conventional model parameters that do not take into consideration the isolation region and the active region adjacent the MISFET, as described in embodiments 1 to 8, thereby enabling use of a conventional circuit simulation execution program for the circuit simulation execution portion.

As descried hereinbefore, the circuit simulation method and the apparatus thereof provides a circuit simulation method having minimized simulation errors, and thus are suitable for a circuit simulation method and an apparatus thereof for carrying out a highly accurate circuit simulation that takes into consideration effects that stress causes on the electrical characteristics of a transistor.

What is claimed is:

1. A circuit simulation method for an integrated circuit, the integrated circuit including active regions isolated from each other by an isolation region, the active regions including a transistor active region having a gate electrode of a transistor formed thereon and at least one peripheral active region arranged around the transistor active region, the method comprising:

(a) generating a model parameter representing effects of stress upon the transistor active region caused by an interface between the transistor active region and the isolation region and an interface between the peripheral active region and the isolation region;

(b) evaluating characteristics of the transistor using a simulation program associated with the model parameter; and (c) acquiring data regarding arrangement and shape of the transistor,
wherein the model parameter is determined on the basis of the data of the transistor.

2. The circuit simulation method according to claim 1, wherein the model parameter includes:
a term regarding a first width of the transistor active region;
a term regarding a second width of the peripheral active region; and
a term regarding a third width between the transistor active region and peripheral active region.

3. The circuit simulation method according to claim 1, wherein:
the at least one peripheral active region contains at least one first peripheral active region being arranged to a side of the transistor active region in a gate length direction; and
the model parameter includes a first parameter representing effects of stress applied to the transistor in the gate length direction, the first parameter including:
a first active region width represented by a distance between an end of the gate electrode and an end of the transistor active region in the gate length direction;

a first isolation region width represented by a distance between the transistor active region and the first peripheral active region; and a second active region width represented by width of the first peripheral active region in the gate length direction.

4. The circuit simulation method according to claim 3, wherein with the first parameter represented by $SA_{eff}$, $SA_{eff}$ is represented by Equation 1:

$$SA_{eff} = SA + f(SL, SE) \quad \text{(Equation 1)}$$

where SA denotes the first active region width, SL denotes the first isolation region width, SE denotes the second active region width, and f(SL, SE) denotes a function with SL and SE as arguments.

5. The circuit simulation method according to claim 3, wherein the first parameter is represented by a polynomial including a term for a reciprocal of a value of the first active region width, a term for a reciprocal of a value of the first isolation region width, and a term for a reciprocal of a value of the second active region width.

6. The circuit simulation method according to claim 5, wherein with the first parameter represented by $SA_{eff}$, $SA_{eff}$ is represented by Equation 2:

$$\frac{1}{SA_{eff}} = \frac{c1}{a+SA} - \frac{c2}{a+SA+SL} + \frac{c3}{a+SA+SL+SE} \quad \text{(Equation 2)}$$

where c1, c2, and c3 denote weighting factors, "a" denotes a variable including a gate length of the transistor as a parameter, SA denotes the first active region width, SL denotes the first isolation region width, and SE denotes the second active region width.

7. The circuit simulation method according to claim 3, wherein:

the at least one first peripheral active region comprises a plurality of first peripheral active regions arranged in series at intervals; and the first parameter includes, as arguments, a first isolation region width for each first peripheral active region and a second active region width for each first peripheral active region.

8. The circuit simulation method according to claim 7, wherein with the first parameter represented by $SA_{eff}(n)$ when the number of the second active regions is n, $SA_{eff}(n)$ is represented by an asymptotic equation shown at Equation 3:

$$\frac{1}{SA_{eff}(n)} = f(1/SA_{eff}(n-1)). \quad \text{(Equation 3)}$$

9. The circuit simulation method according to claim 8, wherein $SA_{eff}(n)$ is represented by Equation 4:

$$\frac{1}{SA_{eff}(n)} = \frac{c1}{SA_{eff}(n-1)} - \frac{c2}{a+SA+\sum_{i=1}^{n} SLi} + \frac{c3}{a+SA+\sum_{i=1}^{n} SLi + \sum_{i=1}^{n} SEi} \quad \text{(Equation 4)}$$

where c1, c2, and c3 denote weighting factors, "a" denotes a variable including a gate length as a parameter, SA denotes the first active region width, SLi denotes a width represented by a distance between an i-th second active region and an active region closer to the transistor than is the i-th second active region, and SEi denotes width of the i-th second active region in the gate length direction.

10. The circuit simulation method according to claim 3, wherein:

the transistor active region includes at least two subregions having a difference in at least one of values of the first active region width, the first isolation region width, and the second active region width of each subregion, each subregion has a first subregion parameter representing effects of stress applied thereto; and the first parameter is represented by a sum of each subregion parameter.

11. The circuit simulation method according to claim 10, wherein with the first parameter represented by $SA_{eff}$ when the number of subregions included in the transistor active region is n, $SA_{eff}$ is represented by Equation 5:

$$\frac{1}{SA_{eff}} = \sum_{i=1}^{n} \frac{Wi}{W} \times \frac{1}{SA_{eff}(i)} \quad \text{(Equation 5)}$$

where $SA_{eff}(i)$ denotes a subregion parameter for an i-th subregion, W denotes width of the transistor active region in a gate width direction, and W(i) denotes width of the i-th subregion in the gate width direction.

12. The circuit simulation method according to claim 3, wherein:

the transistor includes a plurality of partial transistors connected in parallel;

each partial transistor has a partial parameter representing effects of stress therein; and the first parameter is represented by an average of each partial parameter.

13. The circuit simulation method according to claim 12, wherein with the first parameter represented by $SA_{eff}$ when the number of the partial transistors is n, $SA_{eff}$ is represented by Equation 6:

$$\frac{1}{SA_{eff}} = \frac{1}{n} \sum_{i=1}^{n} \frac{1}{SA_{eff}(i)} \quad \text{(Equation 6)}$$

where $SA_{eff}(i)$ denotes a partial parameter for an i-th partial transistor.

14. The circuit simulation method according to claim 3, wherein:

the transistor active region has a first part arranged to one side of the gate electrode and a second part arranged to other side of the gate electrode;

the first part has a first direction parameter representing effects of stress therein;

the second part has a second direction parameter representing effects of stress therein; and the first parameter is represented by an average of the first direction parameter and the second parameter.

15. The circuit simulation method according to claim 14, wherein with the first parameter represented by $SA_{eff}$, $SA_{eff}$ is represented by Equation 7:

$$\frac{1}{SA_{eff}} = \frac{1}{2} \times \left( \frac{c1}{SA_{eff}(1)} + \frac{c2}{SA_{eff}(2)} \right) \quad \text{(Equation 7)}$$

where c1 and c2 denote weighting factors, $SA_{eff}(1)$ denotes the first direction parameter, and $SA_{eff}(2)$ denotes the second direction parameter.

16. The circuit simulation method according to claim 1, wherein:
- the at least one peripheral active region contains at least one second peripheral active region being arranged to a side of the transistor active region in a gate width direction; and
- the model parameter includes a second parameter representing effects of stress applied to the transistor in the gate width direction, the second parameter including:
- a gate width of the transistor;
- a second isolation region width represented by a distance between the transistor active region and the second peripheral active region; and
- a third active region width represented by width of the second peripheral active region in the gate width direction.

17. The circuit simulation method according to claim 16, wherein with the second parameter represented by $SY_{eff}$, $SY_{eff}$ is represented by Equation 8:

$$\frac{1}{SY_{eff}} = \frac{c1}{b} - \frac{c2}{b+SW} + \frac{c3}{b+SW+SF} \quad \text{(Equation 8)}$$

where c1, c2, and c3 denote weighting factors, "b" denotes a variable including a gate width of the transistor as a parameter, SW denotes the second isolation region width, and SF denotes the third active region width.

18. The circuit simulation method according to claim 1, wherein:
- the at least one peripheral active region contains at least one first peripheral active region being arranged to a side of the transistor active region in a gate length direction;
- the at least one peripheral active region contains at least one second peripheral active region being arranged to a side of the transistor active region in a gate width direction;
- the model parameter includes a first parameter representing effects of stress applied to the transistor in a gate length direction and a second parameter representing effects of stress applied to the transistor in a gate width direction;
- the first parameter is represented by an equation including arguments including: a first active region width represented by a distance between an end of the gate electrode and an end of a first active region in the gate length direction; a first isolation region width represented by a distance between the first peripheral active region and the transistor active region; and a second active region width represented by width of the first peripheral active region in the gate length direction; and
- the second parameter includes: a gate width of the transistor; a second isolation region width represented by a distance between the second peripheral active region and the first active region; and a third active region width represented by width of the second peripheral active region in the gate width direction.

19. The circuit simulation method according to claim 18, wherein with the model parameter represented by $SAY_{eff}$, $SAY_{eff}$ is represented by Equation 9:

$$\frac{1}{SAY_{eff}} = \frac{\alpha_A}{SA_{eff}} + \frac{\alpha_Y}{SY_{eff}} \quad \text{(Equation 9)}$$

where $\alpha_A$ and $\alpha_Y$ denote weighting parameters, $SA_{eff}$ denotes the first parameter, and $SY_{eff}$ denotes the second parameter.

20. The circuit simulation method according to claim 18, wherein with the first parameter represented by $SA_{eff}$ and the second parameter represented by $SY_{eff}$, $SA_{eff}$ is represented by Equation 10 and $SY_{eff}$ is represented by Equation 11:

$$\frac{1}{SA_{eff}} = \sum_{line} \int_{along\ the\ line} \frac{d\zeta}{\zeta} \times \frac{\cos\theta}{r} \times \lambda \quad \text{(Equation 10)}$$

$$\frac{1}{SY_{eff}} = \sum_{line} \int_{along\ the\ line} \frac{d\zeta}{\zeta} \times \frac{\sin\theta}{r} \times \lambda \quad \text{(Equation 11)}$$

where $\zeta$ denotes a point on an interface between the isolation region and an active region arranged around the transistor, $d\zeta$ denotes a small region in the interface including $\zeta$, r denotes length of a straight line connecting $\zeta$ and a center of a channel region of the transistor, $\theta$ denotes an angle between the gate length direction and a direction of extending of the straight line connecting $\zeta$ and the center of the channel region of the transistor, and $\zeta$ denotes a coefficient denoting orientation of stress applied to the interface.

21. The circuit simulation method according to claim 1, wherein the characteristics of the transistor include carrier mobility, threshold voltage, and saturated carrier velocity.

* * * * *